United States Patent [19]

Udagawa et al.

[11] Patent Number: 5,792,589
[45] Date of Patent: Aug. 11, 1998

[54] RADIATION SENSITIVE COMPOSITION CONTAINING A FLUORESCENT SUBSTANCE DISPERSED THEREIN

[75] Inventors: Tadahiko Udagawa; Hideaki Masuko; Hiroaki Nemoto, all of Yokkaichi; Nobuo Bessho, Yokohama, all of Japan

[73] Assignee: Japan Synthetic Rubber Co., Ltd., Tokyo, Japan

[21] Appl. No.: 794,935

[22] Filed: Feb. 4, 1997

[30] Foreign Application Priority Data

Feb. 6, 1996 [JP] Japan .................. 8-042178

[51] Int. Cl.$^6$ .................................. G03F 7/031
[52] U.S. Cl. .................. 430/270.1; 430/281.1; 430/916; 522/16; 252/301.36
[58] Field of Search .................. 430/270.1, 281.1, 430/321, 916; 522/16, 81; 252/301.36; 313/502, 484, 486

[56] References Cited

U.S. PATENT DOCUMENTS 3,871,885  3/1975  Hertler ..................... 430/281.1

FOREIGN PATENT DOCUMENTS

| 2-99585 | 4/1990 | Japan . |
|---|---|---|
| 2-153353 | 6/1990 | Japan . |
| 4-116558 | 4/1992 | Japan . |
| 5-205632 | 8/1993 | Japan . |
| 5-205633 | 8/1993 | Japan . |
| 5-20567 | 8/1993 | Japan . |
| 6-75372 | 3/1994 | Japan . |
| 7-152153 | 6/1995 | Japan . |

Primary Examiner—John A. McPherson
Attorney, Agent, or Firm—Oblon, Spivak, McClelland, Maier & Neustadt, P.C.

[57] ABSTRACT

A radiation sensitive composition containing a fluorescent substance dispersed therein, comprising (A) the fluorescent substance, (B) an organic polymer binder, (C) at least one optically crosslinkable compound selected from optically crosslinkable monomers and oligomers, and (D) an optically radical-generating agent which comprises (a) a 2,4,5-triaryl imidazole dimer, (b) an amino group-containing benzophenone photosensitizer, and (c) a thiol compound represented by the following formula (1):

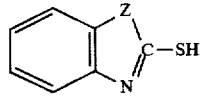

(1)

wherein Z is —O—, —S—, —NH— or —CONH—. This radiation sensitive composition can provide a fluorescent screen having a larger film thickness and a higher display brightness and hence, will greatly contribute to increases in the size and precision of a fluorescent display device such as a plasma display panel.

11 Claims, No Drawings

RADIATION SENSITIVE COMPOSITION CONTAINING A FLUORESCENT SUBSTANCE DISPERSED THEREIN

DETAILED DESCRIPTION OF THE INVENTION

This invention relates to a radiation sensitive composition containing a fluorescent substance dispersed therein. More specifically, it relates to a radiation sensitive composition containing a fluorescent substance dispersed therein, which is suitable as a material for forming a fluorescent screen in a fluorescent display device such as a plasma display panel or the like.

A plasma display panel (PDP) has characteristic features that it can be produced through an easy production process and has a high display quality due to a wide viewing angle and a self-emitting type in spite that it is a large-sized panel. Therefore, it attracts more attention than other flat panel display devices. Particularly, a color PDP is expected to become a mainstream of a display device for a 20-inch or more large-sized wall-type high-definition TV (HDTV) in the near future.

The color PDP makes possible color display by causing ultraviolet light to generate by gaseous discharge and causing a fluorescent substance to emit light by the ultraviolet light. Generally speaking, three fluorescent screens for emitting red light, green light and blue light are formed on a substrate and pixel units of respective colors are present in a uniformly mixed state as a whole.

When describing the color PDP in more detail, a plurality of partitions (called "barrier rib") formed from an insulating substance are provided on the surface of a transparent substrate, and a large number of recesses are defined by the partitions so that a fluorescent screen is formed in each recess, and an electrode for applying plasma is arranged in the fluorescent screen to make each fluorescent screen as a pixel unit.

As a method for producing such a color PDP, there are known a screen printing method in which a pasty fluorescent composition is provided to each pixel unit domain on the surface of a substrate by, for example, a screen printing to form a fluorescent screen, and a photolithography method in which a radiation sensitive fluorescent composition layer is formed, irradiated with ultraviolet light through a mask, and developed to form a fluorescent screen in each pixel unit domain on the surface of a substrate. Particularly, the photolithography facilitates the formation of a fine pattern and is expected to be used in the field of a high-performance color PDP. The development of a radiation sensitive composition containing a fluorescent substance dispersed therein for this purpose is being made assiduously.

This radiation sensitive composition containing a fluorescent substance dispersed therein is a pasty composition containing a fluorescent substance dispersed therein, as exemplified by a known composition containing a fluorescent substance dispersed in a vehicle such as a mixture of polyvinyl alcohol and a diazonium compound or a dichromatic acid compound or-a mixture of gelatin and an organic curing agent (see JP-A 5-205632) (the term "JP-A" as used herein means an "unexamined published Japanese patent application").

However, in the case of the formation of a fluorescent screen for a PDP from the above radiation sensitive composition containing a fluorescent substance dispersed therein, since the fluorescent substance dispersed in the composition hinders the transmission of ultraviolet light and greatly reduces the sensitivity of a radiation sensitive resin component, it is difficult to cause ultraviolet light to reach up to the bottom of each recesses in the surface of the substrate effectually and cure the resin component completely. As a result, the fluorescent layer remaining in the recess is turned thin after the subsequent developing and firing steps, and a sufficient display brightness cannot be obtained.

It is an object of the present invention to provide a novel radiation sensitive composition containing a fluorescent substance dispersed therein.

It is another object of the present invention to provide a radiation sensitive composition containing a fluorescent substance dispersed therein, which can provide a fluorescent screen having a sufficient film thickness and a high display brightness even after irradiation of radiation, development and firing steps.

Other objects and advantages of the present invention will become apparent from the following description.

According to the present invention, the above objects and advantages of the present invention can be attained by a radiation sensitive composition containing a fluorescent substance dispersed therein, comprising:

(A) the fluorescent substance;
(B) an organic polymer binder;
(C) at least one optically crosslinkable compound selected form the group consisting of optically crosslinkable monomers and oligomers; and
(D) an optically radical-generating agent comprising (a) a 2,4,5-triaryl imidazole dimer, (b) an amino group-containing benzophenone photosensitizer, and (c) a thiol compound represented by the following formula (1):

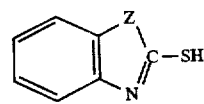

(1)

wherein Z is —O—, —S—, —NH— or —CONH—.

The present invention will be described in detail hereinafter.

(A) Fluorescent substance

The fluorescent substance used in the present invention is not limited to a particular kind and may be suitably selected from the following examples.

Typical examples of the fluorescent substances for emitting red light include $Y_2O_3$:Eu, $Y_2SiO_5$:Eu, $Y_3Al_5O_{12}$:Eu, $YVO_4$:Eu, (Y,Gd)BO$_3$:Eu and $Zn_3(PO_4)_2$:Mn and the like. They may be used alone or in combination of two or more.

Typical examples of fluorescent substances for emitting green light include $Zn_2SiO_4$:Mn, $BaAl_{12}O_{19}$:Mn, $BaMgAl_{14}O_{23}$:Mn, $LaPO_4$:(Ce,Tb), $Y_3(Al,Ga)_5O_{12}$:Tb and the like. They may be used alone or in combination of two or more.

Typical examples of fluorescent substances for emitting blue light include $Y_2SiO_5$:Ce, $BaMgAl_{14}O_{23}$:Eu, (Ca,Sr,Ba)$_{10}$(PO$_4$)$_6$Cl$_2$:Eu, (Ba,EU)MgAl$_{10}$O$_{17}$, $Y_2SiO_5$:Ce and (Zn,Cd)S:Ag and the like. They may be used alone or in combination of two or more.

The amount of the fluorescent substance used is generally 0.1 to 20 parts by weight, preferably 0.2 to 15 parts by weight, based on 1 part by weight of the organic polymer binder (B). When the amount of the fluorescent substance is less than 0.1 part by weight, the density of the fluorescent substance in the fluorescent screen will decrease and hence, sufficient display brightness cannot be obtained. On the other hand, when the amount is more than 20 parts by weight, it is liable to occur that stains remain or a residual film remains on the base film surface of portions not exposed to irradiation of the radiation.

(B) Organic polymer binder

As the organic polymer binder used in the present invention may be used various resins, of which alkali-soluble resins are particularly preferred. The term "alkali-soluble" resin as used herein means a resin having such a degree of solubility that a resin dissolves into an alkali developer (to be described later) to allow the development treatment to be carried out.

Preferred alkali-soluble resins include (meth)acrylic resins, hydroxystyrene resins, novolak resins and the like.

Of these alkali-soluble resins, particularly preferred are copolymers of the following monomers (α) and (β) and copolymers of the following monomers (α), (β) and (γ).

Illustrative examples of the monomer (α) include carboxyl group-containing monomers such as acrylic acid, methacrylic acid, maleic acid, fumaric acid, crotonic acid, itaconic acid, citraconic acid, mesaconic acid and cinnamic acid; hydroxyl group-containing monomers such as 2-hydroxyethyl (meth)acrylate, 2-hydroxypropyl (meth)acrylate and 3-hydroxypropyl (meth)acrylate; phenolic hydroxyl-group containing monomers such as o-hydroxystyrene, m-hydroxystyrene and p-hydroxystyrene; and other alkali-soluble functional group-containing monomers.

These monomers (α) may be used alone or in admixture of two or more.

Illustrative examples of the monomer (β) include (meth)acrylic acid esters containing no hydroxyl group such as methyl (meth)acrylate, ethyl (meth)acrylate, benzyl (meth)acrylate, glycidyl (meth)acrylate and dicyclopentanyl (meth)acrylate; aromatic vinyl monomers such as styrene and α-methyl styrene; conjugated dienes such as 1,3-butadiene and isoprene.

These monomers (β) may be used alone or in admixture of two or more.

Illustrative examples of the monomer (γ) include macromonomers having a polymerizable unsaturated group such as (meth)acryloyl group at one terminal of a polymer chain, such as polystyrene, polymethyl (meth)acrylate, polyethyl (meth)acrylate and polybenzyl (meth)acrylate.

These monomers (γ) may be used alone or in admixture of two or more.

The content of the monomer (α) in the production of the copolymer is generally 5 to 50% by weight, preferably 10 to 40% by weight, based on the total weight of the monomers. When the content of the monomer (α) is less than 5% by weight, the solubility of the organic polymer binder in an alkali developer will lower and in consequence, it is liable to occur that stains remain or a residual film remains on the base film surface of portions not exposed to irradiation of the radiation. On the other hand, when the content of the monomer (α) is more than 50% by weight, the solubility of the organic polymer binder in the alkali developer will be excessively high, whereby the fluorescent screen is liable to fall off from the substrate.

The weight average molecular weight (to be referred to as "Mw" hereinafter) in terms of polystyrene measured by gel permeation chromatography (GPC, carrier: tetrahydrofuran) of the organic polymer binder is generally 5,000 to 1,000,000, preferably 10,000 to 700,000. When Mw of the organic polymer binder is less than 5,000, the development time interval obtained from the optimum development is narrowed, that is, a development margin becomes small. On the other hand, when Mw is more than 1,000,000, scum tends to generate around a portion exposed to radiation after development and hence, pattern edge sharpness will be apt to be insufficient and it is liable to occur that stains remain or a residual film remains on the base film surface of portions not exposed to irradiation of the radiation.

Further, organic polymer binders other than the above alkali-soluble resins include, for example, polyvinyl alcohol, polyethylene glycol monoalkyl ethers, methyl cellulose, ethyl cellulose, hydroxymethyl cellulose, hydroxyethyl cellulose, hydroxypropyl cellulose, hydroxypropyl methyl cellulose, hydroxypropyl.ethyl cellulose, carboxymethyl cellulose, gelatin, casein and the like.

In the present invention, the organic polymer binders may be used alone or in admixture of two or more.

(C) Optically crosslinkable monomers and oligomers

Optically crosslinkable monomers and oligomers used in the present invention include di(meth)acrylates of alkylene glycol such as ethylene glycol and propylene glycol; di(meth)acrylates of polyalkylene glycol such as polyethylene glycol and polypropylene glycol; polyvalent (meth) acrylates of polyvalent hydroxy compounds such as glycerine, trimethylolpropane, pentaerythritol, dipentaerythritol and trishydroxyethylphosphate; oligo(meth)acrylates such as polyesters, epoxy resins, urethane resins, alkyd resins, silicone resins and spiran resins; di(meth)acrylates of both-termini hydroxylated polymers such as both-termini hydroxypolybutadiene, both-termini hydroxypolyisoprene and both-termini hydroxypolycaprolactone; (co)polymer resins of 4-(meth)acryloylphenylcinnamoyl esters; condensates of 4-azidobenzaldehyde with hydroxyl group-containing resins such as polyvinyl alcohol and phenol novolak resins; and the like.

Of these optically crosslinkable monomers and oligomers, particularly preferred are polyvalent (meth)acrylates of polyvalent hydroxy compounds such as tripropylene glycol di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tris(meth)acryloyloxyethyl phosphate and the like.

These optically crosslinkable monomers and oligomers may be used alone or in admixture of two or more.

The amount of the optically crosslinkable monomer and/or oligomer used is preferably 0.05 to 5 parts by weight, particularly preferably 0.2 to 2 parts by weight based on 1 part by weight of the organic polymer binder (B). When the amount of the optically crosslinkable monomer and/or oligomer is less than 0.05 part by weight, the fluorescent screen is liable to fall off from the substrate, while when the amount is more than 5 parts by weight, it is liable to occur that stains remain or a residual film remains on the base film surface of portions not exposed to irradiation of the radiation.

(D) Optically radical-generating agent

The optically radical-generating agent used in the present invention contains (a) a 2,4,5-triarylimidazole dimer (to be referred to as "component (a)" hereinafter), (b) an amino group-containing benzophenone photosensitizer (to be referred to as "component (b)" hereinafter) and (c) a thiol compound represented by the above formula (1) (to be referred to as "component (c)" hereinafter). The component (c) is a chain transfer agent.

The component (a) is an imidazolyl dimer having a substituted or unsubstituted aryl group at 2, 4 and 5-positions of each two imidazole rings.

Illustrative examples of the component (a) include 2,2', 4,4',5,5'-hexaphenylbiimidazole, 2,2'-bis(2-fluorophenyl)4, 4',5,5'-tetraphenylbiimidazole, 2,2'-bis(2,4-difluorophenyl)-4,4',5,5'-tetraphenylbiimidazole, 2,2'-bis(2,4,6- trifluorophenyl)-4,4',5,5'-tetraphenylbiimidazole, 2,2'-bis(2-chlorophenyl)-4,4',5,5'-tetraphenylbiimidazole, 2,2'-bis(4-chlorophenyl)-4,4',5,5'-tetraphenylbiimidazole, 2,2'-bis(2,4-dichlorophenyl)-4,4',5,5'-tetraphenylbiimidazole, 2,2'-bis(2,4,6-trichlorophenyl)-4,4',5,5'-tetraphenylbiimidazole, 2,2'-bis(2-chlorophenyl)-4,4',5,5'-tetrakis(3-methylphenyl)biimidazole, 2,2'-bis(2-chlorophenyl)-4,4',5,5'-tetrakis(4-methylphenyl)biimidazole, 2,2'-bis(2-chlorophenyl)-4,4',5,5'-tetrakis(3-methoxyphenyl)biimidazole, 2,2'-bis(2-chlorophenyl)-4,4',5,5'-tetrakis(4-methoxyphenyl)biimidazole, 2,2'-bis(2-chlorophenyl)-4,4',5,5'-tetrakis(3,4,5-trimethoxyphenyl)biimidazole, 2,2'-bis(2-chlorophenyl)-4,4',5,5'-tetrakis(4-methoxycarbonylphenyl)biimidazole, 2,2'-bis(2-chlorophenyl)-4,4',5,5'-tetrakis(4-ethoxycarbonylphenyl)biimidazole, 2,2'-bis(2-chlorophenyl)-4,4',5,5'-tetrakis(4-phenoxycarbonylphenyl)biimidazole, 2,2'-bis(2,4-dichlorophenyl)-4,4',5,5'-tetrakis(4-methoxycarbonylphenyl)biimidazole, 2,2'-bis(2,4-dichlorophenyl)-4,4',5,5'-tetrakis(4-ethoxycarbonylphenyl)biimidazole, 2,2'-bis(2,4-dichlorophenyl)-4,4',5,5'-tetrakis(4-phenoxycarbonylphenyl)biimidazole, 2,2'-bis(2,4,6-trichlorophenyl)-4,4',5,5'-tetrakis(4-methoxycarbonylphenyl)biimidazole, 2,2'-bis(2,4,6-trichlorophenyl)-4,4',5,5'-tetrakis(4-ethoxycarbonylphenyl)biimidazole, 2,2'-bis(2,4,6-trichlorophenyl)-4,4',5,5'-tetrakis(4-phenoxycarboylphenyl)biimidazole, 2,2',4,4'-tetrakis(4-chlorophenyl)-5,5'-diphenylbiimidazole, 2,2'-bis(2-bromophenyl)-4,4',5,5'-tetraphenylbiimidazole, 2,2'-bis(2,4-dibromophenyl)-4,4',5,5'-tetraphenylbiimidazole, 2,2'-bis(2,4,6-tribromophenyl)-4,4',5,5'-tetraphenylbiimidazole, 2,2'-bis(2-methylphenyl)-4,4',5,5'-tetraphenylbiimidazole, 2,2'-bis(2,4-dimethylphenyl)-4,4',5,5'-tetraphenylbiimidazole, 2,2'-bis(2,4,6-trimethylphenyl)-4,4',5,5'-tetraphenylbiimidazole, 2,2'-bis(2-methylphenyl)-4,4',5,5'-tetrakis(3-methoxyphenyl)biimidazole, 2,2'-bis(2-methylphenyl)-4,4',5,5'-tetrakis(4-methoxyphenyl)biimidazole, 2,2'-bis(2-methylphenyl)-4,4',5,5'-tetrakis(3,4,5-trimethoxyphenyl)biimidazole, 2,2'-bis(2-methylphenyl)-4,4',5,5'-tetrakis(4-methoxycarbonylphenyl)biimidazole, 2,2'-bis(2-methylphenyl)-4,4',5,5'-tetrakis(4-ethoxycarbonylphenyl)biimidazole, 2,2'-bis(2-methylphenyl)-4,4',5,5'-tetrakis(4-phenoxycarbonylphenyl)biimidazole, 2,2'-bis(2-ethylphenyl)-4,4',5,5'-tetraphenylbiimidazole, 2,2'-bis(2,4-diethylphenyl)-4,4',5,5'-tetraphenylbiimidazole, 2,2'-bis(2,4,6-triethylphenyl)-4,4',5,5'-tetraphenylbiimidazole, 2,2'-bis(2-ethylphenyl)-4,4',5,5'-tetrakis(4-methoxyphenyl)biimidazole, 2,2'-bis(2-ethylphenyl)-4,4',5,5'-tetrakis(4-methoxycarbonylphenyl)biimidazole, 2,2'-bis(2-ethylphenyl)-4,4',5,5'-tetrakis(4-ethoxycarbonylphenyl)biimidazole, 2,2'-bis(2-ethylphenyl)-4,4',5,5'-tetrakis(4-phenoxycarbonylphenyl)biimidazole, 2,2'-bis(2-methoxyphenyl)-4,4',5,5'-tetraphenylbiimidazole, 2,2'-bis(4-methoxyphenyl)-4,4',5,5'-tetraphenylbiimidazole, 2,2'-bis(2,4-dimethoxyphenyl)-4,4',5,5'-tetraphenylbiimidazole, 2,2'-bis(2,4,6-trimethoxyphenyl)-4,4',5,5'-tetraphenylbiimidazole, 2,2'-bis(2-methoxyphenyl)-4,4',5,5'-tetrakis(4-methoxycarbonylphenyl)biimidazole, 2,2'-bis(2-methoxyphenyl)-4,4',5,5'-tetrakis(4-ethoxycarbonylphenyl)biimidazole, 2,2'-bis(2-methoxyphenyl)-4,4',5,5'-tetrakis(4-phenoxycarbonylphenyl)biimidazole, 2,2',4,4'-tetrakis(4-methoxyphenyl)-5,5'-diphenylbiimidazole, 2,2'-bis(2-methylmercaptophenyl)-4,4',5,5'-tetraphenylbiimidazole, 2,2'-bis(4-methylmercaptophenyl)-4,4',5,5'-tetraphenylbiimidazole, 2,2'-bis(2-methylmercaptophenyl)-4,4',5,5'-tetrakis(4-methoxyphenyl)biimidazole, 2,2'-bis(2-methylmercaptophenyl)-4,4',5,5'-tetrakis(4-methoxycarbonylphenyl)biimidazole, 2,2'-bis(2-methylmercaptophenyl)-4,4',5,5'-tetrakis(4-ethoxycarbonylphenyl)biimidazole, 2,2'-bis(2-methylmercaptophenyl)-4,4',5,5'-tetrakis(4-phenoxycarbonylphenyl)biimidazole, 2,2'-bis(2-nitrophenyl)-4,4',5,5'-tetraphenylbiimidazole, 2,2'-bis(2,4-dinitrophenyl)-4,4',5,5'-tetraphenylbiimidazole, 2,2'-bis(2,4,6-trinitrophenyl)-4,4',5,5'-tetraphenylbiimidazole, 2,2'-bis(2-nitrophenyl)-4,4',5,5'-tetraphenyl biimidazole, 2,2'-bis(2-nitrophenyl)-4,4',5,5'-tetrakis(4-methoxyphenyl)biimidazole, 2,2'-bis(2-nitrophenyl)-4,4',5,5'-tetrakis(4-methoxycarbonylphenyl)biimidazole, 2,2'-bis(2-nitrophenyl)-4,4',5,5'-tetrakis(4-ethoxycarbonylphenyl)biimidazole, 2,2'-bis(2-nitrophenyl)-4,4',5,5'-tetrakis(4-phenoxycarbonylphenyl)biimidazole, 2,2'-bis(2-cyanophenyl)-4,4',5,5'-tetraphenylbiimidazole, 2,2'-bis(2,4-dicyanophenyl)-4,4',5,5'-tetraphenylbiimidazole, 2,2'-bis(2,4,6-tricyanophenyl)-4,4',5,5'-tetraphenylbiimidazole, 2,2'-bis(2-cyanophenyl)-4,4',5,5'-tetrakis(4-methoxyphenyl)biimidazole, 2,2'-bis(2-cyanophenyl)-4,4',5,5'-tetrakis(4-methoxycarbonylphenyl)biimidazole, 2,2'-bis(2-cyanophenyl)-4,4',5,5'-tetrakis(4-ethoxycarbonylphenyl)biimidazole, 2,2'-bis(2-cyanophenyl)-4,4',5,5'-tetrakis(4-phenoxycarbonylphenyl)biimidazole, 2,2'-bis(2-phenylphenyl)-4,4',5,5'-tetraphenylbiimidazole, 2,2'-bis(2,4-diphenylphenyl)-4,4',5,5'-tetraphenylbiimidazole, 2,2'-bis(2,4,6-triphenylphenyl)-4,4',5,5'-tetraphenylbiimidazole, 2,2'-bis(2-phenylphenyl)-4,4',5,5'-tetrakis(4-methoxyphenyl)biimidazole, 2,2'-bis(2-phenylphenyl)-4,4',5,5'-tetrakis(4-methoxycarbonylphenyl)biimidazole, 2,2'-bis(2-phenylphenyl)-4,4',5,5'-tetrakis(4-ethoxycarbonylphenyl)biimidazole, 2,2'-bis(2-phenylphenyl)-4,4',5,5'-tetrakis(4-phenoxycarbonylphenyl)- 4,4',5,5'-tetrakis(4-phenoxycarbonylphenyl)biimidazole, 2,2'-bis(1-naphthyl)-4,4',5,5'-tetraphenylbiimidazole, 2,2'-bis(2-naphthyl)-4,4',5,5'-tetraphenylbiimidazole, 2,2'-bis(2-fluoro-1-naphthyl)-4,4',5,5'-tetraphenylbiimidazole, 2,2'-bis(2-chloro-1-naphthyl)-4,4',5,5'-tetraphenylbiimidazole, 2,2'-bis(4-chloro-1-naphthyl)-4,4',5,5'-tetraphenylbiimidazole, 2,2'-bis(2,4-dichloro-1-naphthyl)-4,4',5,5'-tetraphenylbiimidazole, 2,2'-bis(2-bromo-1-naphthyl)-4,4',5,5'-tetraphenylbiimidazole, 2,2'-bis(2-methyl-1-naphthyl)-4,4',5,5'-tetraphenylbiimidazole, 2,2'-bis(4-methyl-1-naphthyl)-4,4',5,5'-tetraphenylbiimidazole, 2,2'-bis(2,4'-dimethyl-1-naphthyl)-4,4',5,5'-tetraphenylbiimidazole, 2,2'-bis(2-methoxy-1-naphthyl)-4,4',5,5'-tetraphenylbiimidazole, 2,2'-bis(4-methoxy-1-naphthyl)-4,4',5,5'-tetraphenylbiimidazole, 2,2'-bis(2,4'-dimethoxy-1-naphthyl)-4,4',5,5'-tetraphenylbiimidazole, 2,2'-bis(1-naphthyl)-4,4',-4,4',5,5'-tetrakis(2-chlorophenyl)biimidazole, 2,2'-bis(1-naphthyl)-4,4',5,5'-tetrakis(4-chlorophenyl)biimidazole, 2,2'-bis(1-naphthyl)-4,4',5,5'-tetrakis(2-methylphenyl)biimidazole, 2,2'-bis(1-naphthyl)-4,4',5,5'-tetrakis(4-methylphenyl)biimidazole, 2,2'-bis(1-naphthyl)-4,4',5,5'-tetrakis(2-methoxyphenyl)biimidazole, 2,2'-bis(1-naphthyl)-4,4',5,5'-tetrakis(4-methoxyphenyl)biimidazole, 2,2'-bis(9-anthranyl)-4,4',5,5'-tetraphneylbiimidazole, 2,2'-dipyrenyl-4,4',5,5'-tetraphenylbiimidazole, 2,2'-bis(9-phenantolyl)-4,4',5,5'-tetaphenylbiimidazole and the like.

These components (a) may be used alone or in admixture of two or more.

Illustrative examples of the component (b) include 4,4'-bis(dimethylamino)benzophenone, 4,4'-bis(diethylamino)benzophenone, 4,4'-bis(di-n-propylamino)benzophenone, 4,4'-bis(di-n-butylamino)benzophenone, 4,4'-bis(methylamino)benzophenone, 4,4'-bis(ethylamino)benzophenone, 4,4'-diaminobenzophenone, 4-dimethylaminobenzophenone, 4-diethylaminobenzophenone, 4-methylaminobenzophenone, 4-ethylaminobenzophenone, 4-aminobenzophenone, 4-methoxy-4'-dimethylaminobenzophenone, 4-methoxy-4'-diethylaminobenzophenone and the like.

These components (b) may be used alone or in admixture of two or more.

Illustrative examples of the component (c) include 2-mercaptobenzothiazole, 2-mercaptobenzoxazole, 2-mercaptobenzoimidazole and 2-mercapto-4(3H)-quinazolinone.

These components (c) may be used alone or in admixture of two or more.

As for the proportion of each component of the optically radical-generating agent in the present invention, the proportion of the component (b) is generally 0.1 to 10 parts by weight, preferably 0.2 to 5 parts by weight, and that of the component (c) is generally 0.1 to 10 parts by weight, preferably 0.2 to 5 parts by weight, based on 1 part by weight of the component (a).

The amount of the optically radical-generating agent used is generally 0.05 to 5 parts by weight, preferably 0.1 to 4 parts by weight, based on 1 part by weight of the optically crosslinkable monomer and/or oligomer. When the amount of the optically radical-generating agent used is less than 0.05 part by weight, it is impossible to cause a crosslinking reaction to proceed fully with the irradiation of radiation and a pixel pattern may have an undercut. On the other hand, when the amount is more than 5 parts by weight, the pixels may fall off from the substrate at the time of development and it is liable to occur that stains remain or a residual film remains on the base film surface of portions not exposed to irradiation of the radiation.

Further, in the present invention, other curing promotor, optically radical-generating agent and the like (collectively to be referred to be as "other curing promoters" hereinafter) can be used in combination with the above optically radical generating agent.

The other curing promoters include, for example, carbonyl compounds, azo compounds, azide compounds, organic sulfur compounds, peroxides, trihalomethane compounds and the like.

The carbonyl compounds include, for example, diacetyl, benzyl, benzoin, 2-hydroxy-1-methyl-1-phenylpropane-1-one, 1-(4-isopropylphenyl)-2-hydroxy-2-methylpropane-1-one, 4-(2-hydroxyethoxy)phenyl-(2-hydroxy-2-propyl) ketone, 1-hydroxycyclohexylphenyl ketone, 2,2-dimethoxy-2-phenylacetophenone, 2-methyl-[4-(methylthio)phenyl]-2-morpholino-1-propane-1-one, 2-benzyl-2-dimethylamino-1-(4-morpholinophenyl)butane-2-one, benzophenone, 3,3-dimethyl-4-methoxybenzophenone, 2,4-diethylthioxanthone and the like. These carbonyl compounds may be used alone or in admixture of two or more.

The azo compounds and azide compounds include azoisobutyronitrile, azoisovarelonitrile, 4-azidobenzaldehyde, 4-azidoacetophenone, 4-azidobenzalacetophenone, 4-azidobenzalacetone, azidopyrene, 4-diazodiphenylamine, 4-diazo-4'-methoxydiphenylamine, 4-diazo-3'-methoxydiphenylamine, diazidocarcon, 2,6-bis(4'-azidobenzal)cyclohexanone, 2,6-bis(4'-azidobenzal)-4-methylcyclohexanone, 1,3-bis(4'-azidobenzal)-2-propanone, 1,3-bis(4'-azidocinnamylidene)-2-propanone, 4,4'-diazidostilbene and the like. These azo compounds and azide compounds may be used alone or in admixture of two or more.

The organic sulfur compounds include mercaptans such as n-octylmercaptan, n-dodecylmercaptan and t-dodecylmercaptan; disulfides such as dimethylxanthogen disulfide and tetraethylthiuram disulfide; and the like. These mercaptans and disulfides may be used alone or in admixture of two or more.

The peroxides include cumene hydroperoxide, paramenthane hydroperoxide, di-t-butyl peroxide, dicumyl peroxide, diethyl ether peroxide and the like. These peroxides may be used alone or in admixture of two or more.

The trihalomethane compounds include 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine and the like. These trihalomethane compounds may be used alone or in admixture of two or more.

As the curing promoters other than those described above, ammonium dichromate, potassium dichromate and the like may be also added.

The total amount of these other curing promotors used in the present invention is preferably not more than 80% by weight of the amount of the whole optically radical-generating agent (D).

Additives

The composition of the present invention may contain various additives such as a thermosetting resin, curing catalyst for thermosetting resins, adhesion promoting agent, filler, surfactant, antioxidant, ultraviolet absorber and agglomeration inhibitor as required, in addition to the above components (A) to (D).

Illustrative examples of the thermosetting resin include epoxy resins, melamine resins, urea resins, aniline resins, phenol resins, unsaturated polyester resins, acrylate resins and the like.

Illustrative examples of the catalyst for thermosetting resins include polyvalent amines, acid anhydrides, antimony fluoride compounds and the like for epoxy resins; ammonium salts, alcohol amines, metal salts and organic acids for melamine resins, urea resins and aniline resins; peroxides such as benzoyl peroxide and methyl ethyl ketone peroxide for unsaturated polyester resins; and azo compounds such as azoisobutyronitrile and azoisovaleronitrile, benzyl compounds such as p,p'-dimethoxybenzyl and p,p'-dichlorobenzyl, acetophenones such as 2,2-diethoxyacetophenone and 2,2-dimethyl-2-hydroxyacetophenone and the like for acrylate resins.

Illustrative examples of the adhesion promoting agent include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane and the like.

Illustrative examples of the filler include a glass having a low-melting point, alumina, silica and the like.

Illustrative examples of the surfactant include nonionic surfactants, cationic surfactant, anionic surfactants and the like.

Illustrative examples of the antioxidant include 2,2-thiobis(4-methyl-6-t-butylphenol), 2,6-di-t-butylphenol and the like.

Illustrative examples of the ultraviolet absorber include 2-(3-t-butyl-5-methyl-2-hydroxyphenyl)-5-chlorobenzotriazole, alkoxybenzophenone and the like.

Illustrative examples of the agglomeration inhibitor include sodium polyacrylate, polyethylene glycol and the like.

In addition, an inorganic pigment, organic pigment and dye may be used as required.

The above additives may be used alone or in admixture of two or more.

Solvent

The composition containing a fluorescent substance dispersed therein of the present invention may be used directly or as a liquid composition containing a fluorescent substance dispersed therein and component(s) other than the fluorescent substance (A) which is(are) dissolved in an appropriate solvent.

Illustrative examples of the solvent include ethers, esters, ether esters, ketones, ketone esters, amides, amide esters, lactams, lactones, sulfoxides, sulfones, (halogenated) hydrocarbons and the like. More specifically, examples thereof include tetrahydrofuran, anisole, dioxane, ethylene glycol monoalkyl ethers, diethylene glycol monoalkyl ethers, diethylene glycol dialkyl ethers, propylene glycol monoalkyl ethers, propylene glycol dialkyl ethers, acetic acid esters, hydroxy acetic acid esters, alkoxy acetic acid esters, propionic acid esters, hydroxy acetic acid esters, alkoxy acetic acid esters, propionic acid esters, hydroxy propionic acid esters, alkoxy propionic acid esters, lactic acid esters, ethylene glycol monoalkyl ether acetates, diethylene glycol monoalkyl ether acetates, propylene glycol monoalkyl ether acetates, cyclic or non-cyclic ketones, acetoacetic acid esters, pyruvic acid esters, N,N-dialkyl formamides, N,N-dialkyl acetoamides, N-alkyl pyrolidones, γ-lactones, dialkyl sulfoxides, dialkyl sulfones, terpineols, a mixture of ethanol and water, and the like.

These solvents may be used alone or in admixture of two or more.

The amount of the solvent used is 0.05 to 10 parts by weight, preferably 0.1 to 5 parts by weight based on 1 part by weight of the whole solids content of the composition containing a fluorescent substance dispersed therein of the present invention.

The composition containing a fluorescent substance dispersed therein of the present invention can be prepared by mixing the components (A) to (D) with the above additives or the solvent which may be used optionally by a mixer such as a ball mill, pebble mill, shaker, homogenizer, triple roll mill, sand mill or the like.

The composition containing a fluorescent substance dispersed therein of the present invention can be extremely advantageously used in the formation of a fluorescent screen for a fluorescent display device such as a plasma display panel.

The plasma display panel has partitions for defining a discharge space and display electrodes on a transparent substrate such as a glass substrate. A recess between adjacent partitions is filled with a fluorescent substance layer of a radiation sensitive resin composition containing a fluorescent substance dispersed therein, provided by the present invention, by screen printing for example, and the fluorescent substance layer is irradiated with light through a mask, developed and fired to form a fluorescent screen.

As the radiation used for the production of a plasma display panel, preferably used are visible light, ultraviolet light, far-ultraviolet light and the like. The irradiation conditions including the amount of radiation to be irradiated are properly selected depending on composition of the composition.

The firing is carried out under the conditions of a heating temperature of generally 300° to 800° C., preferably 400° to 600° C. and a heating time of generally 1 to 360 minutes, preferably 10 to 240 minutes.

The developer used in the production of a plasma, display panel is selected from aqueous solutions of alkaline compounds such as sodium hydroxide, potassium hydroxide, sodium carbonate, tetramethyl ammonium hydroxide and the like, and water, of which aqueous solutions of alkaline compounds are preferred.

The concentration of an alkaline compound in an aqueous solution is generally 0.005 to 5% by weight, preferably 0.01 to 3% by weight. The developer which is an aqueous solution of an alkaline compound may contain a water-soluble organic solvent such as methanol or ethanol, and a surfactant in suitable amounts. When the developer which is an aqueous alkaline solution is used, the composition of the present invention is usually washed with water after development.

The fluorescent substance layer of the composition containing a fluorescent substance dispersed therein of the present invention can be cured uniformly up to a deep portion of the film by the application of radiation even when it has a film thickness of about 200 μm, and therefore, a fluorescent screen having a large film thickness and high display brightness can be formed.

The following examples are given to further illustrate the present invention. However, these examples are intended to illustrate the invention and not to be construed to limit the scope of the invention. "%" and "parts" in the following examples mean "% by weight" and "parts by weight", respectively.

Synthesis Example 1 ethylene glycol monoethyl ether acetate . . . 100 parts
methyl methacrylate . . . 70 parts
methacrylic acid . . . 30 parts
azoisobutyronitrile . . . 1 part The above components were charged into an autoclave equipped with a stirrer and stirred at room temperature until an uniform mixture could be obtained, and then, the temperature was elevated to 80° C. Polymerization was carried out at 80° C. for 3 hours and further at 100° C. for 2 hours, and thereafter, the temperature was reduced to room temperature to obtain a polymer solution A. During polymerization, air cut-off by nitrogen and stirring were continued. The resulting polymer (to be referred to as "polymer A") had a polymerization yield of 98% and an Mw, measured with GPC (HLC-802A, a product of Tosoh Corporation), of 100,000.

EXAMPLE 1

The following composition containing a fluorescent substance dispersed therein was applied to a 1.1 mm-thick glass substrate having predetermined electrodes and ribs by screen printing and dried in a clean oven at 80° C. for 10 minutes to form a 200 μm-thick fluorescent substance layer.

composition containing a fluorescent substance dispersed therein fluorescent substance: $Y_2O_3$:Eu (red) 750 parts
organic polymer binder: polymer A of synthesis Example 1 70 parts
optically crosslinkable monomer: pentaerythritol tetracrylate 80 parts
optically radical-generating agent:
    2,2'-bis(2-chlorophenyl)-4,4',5,5'-tetraphenyl-biimidazole (to be referred to as "component (a-1)") 10 parts 4,4'-diethylamnobenzophenone 10 parts 2-mercaptobenzothiazole 5 parts Irgacure 1700 (*1) 10 parts solvent: ethyl 3-ethoxypropionate 100 parts (*1) a mixture of 2-hydroxy-2-methyl-1-phenylpropane-1-one and bisacylphosphine oxide in a weight ratio of 3:1

The thus obtained fluorescent substance layer was irradiated with ultraviolet light (i-ray having a wavelength of 365 nm) from a ultrahigh-pressure mercury lamp through a mask in an irradiation amount of 100 mJ/cm$^2$. Thereafter, the layer was subjected to a shower development in a 0.1 wt % aqueous solution of potassium hydroxide for 2 minutes and then to of shower washing with highly purified water for 1 minute to remove the fluorescent substance layer in portions not exposed to ultraviolet light, and dried in the air.

Thereafter, the layer was heated in a clean oven at 180° C. for 30 minutes and fired at 520° C. in a firing furnace for 30 minutes to form a fluorescent screen for light emission, whereby a plasma display panel was produced.

The thus obtained plasma display panel was sufficient in thickness with a florescent screen film thickness of about 200 μm, and exhibited a high display brightness at the time of operation.

The evaluation results are shown in Table 1.

EXAMPLES 2 to 4

Compositions containing a fluorescent substance dispersed therein and plasma display panels were prepared in the same manner as in Example 1 except that components and developers shown in Table 1 were used.

The thus obtained plasma display panels had sufficient thickness with a florescent screen film thickness of about 200 μm and exhibited a high display brightness at the time of operation.

The evaluation results are shown in Table 1.

EXAMPLES 5 and 6

Compositions containing a fluorescent substance dispersed therein and plasma display panels were prepared in the same manner as in Example 1 except that components and developers shown in Table 2 were used.

The thus obtained plasma display panels had sufficient thickness with a florescent screen film thickness of about 200 μm and exhibited a high display brightness at the time of operation.

The evaluation results are shown in Table 2.

Comparative Examples 1 and 2

Compositions containing a fluorescent substance dispersed therein and plasma display panels were prepared in the same manner as in Example 1 except that components and developers shown in Table 2 were used.

As a result, in the plasma display panel of Comparative Example 1, a large amount of a film remained on the base film surface of portions not exposed to ultraviolet light irradiation, and the display brightness at the time of operation was insufficient. The film thickness of the fluorescent screen of Comparative Example 1 was 15 μm.

In the plasma display panel of Comparative Example 2, since part of the fluorescent substance layer was washed away during development, the film thickness of the fluorescent screen was 3 μm. Thus, a sufficient film thickness was not obtained and the display brightness at the time of operation was unsatisfactory.

The evaluation results are shown in Table 2.

TABLE 1

| | Examples | | | |
|---|---|---|---|---|
| | 1 | 2 | 3 | 4 |
| fluorescent substance | $Y_2O_3$:Eu | $Y_2SiO_5$:Ce | $Zn_2SiO_4$:Mn | (Zn, Cd)S:Ag |
| organic polymer binder | polymer A | polymer A | polymer A | hydroxypropyl cellulose |
| optically crosslinkable monomer | pentaerythritol tetracrylate | pentaerythritol tetracrylate | dipentaerythritol hexacrylate | pentaerythritol triacrylate |
| optically radical-generating agent | component (a-1) 4,4'-diethylamino-benzophenone 2-mercaptobenzo-thiazole Irgacure 1700 | component (a-1) 4,4'-diethylamino-benzophenone 2-mercaptobenzo-thiazole — | component (a-1) 4,4'-diethylamino-benzophenone 2-mercaptobenzo-thiazole — | component (a-1) 4,4'-diethylamino-benzophenone 2-mercaptobenzo-thiazole — |
| solvent | ethyl 3-ethoxypropionate | ethyl 3-ethoxypropionate | ethyl 3-ethoxypropionate | — |
| developer | 0.1% aqueous solution of KOH | 0.1% aqueous solution of KOH | 0.1% aqueous solution of KOH | water |
| evaluation | | | | |
| patterning property | good | good | good | good |
| film thickness of fluorescent screen | about 200 μm | about 200 μm | about 200 μm | about 200 μm |

TABLE 2

| | Examples | | Comparative Example | |
|---|---|---|---|---|
| | 5 | 6 | 1 | 2 |
| fluorescent substance | $Zn_2SiO_4$:Mn | $BaMgAl_{14}O_{23}$:Eu | $Y_2SiO_5$:CeO | (Zn, Cd)S:Ag |
| organic polymer binder | gelatin | casein | polymer A | hydroxypropyl cellulose |
| optically crosslinkable monomer | pentaerythritol triacrylate | pentaerythritol triacrylate | pentaerythritol tetracrylate | pentaerythritol triacrylate |
| optically radical-generating agent | component (a-1) 4,4'-diethylamino-benzophenone 2-mercaptobenzothiazole 4-diazo-4'-methoxy-diphenylamine | component (a-1) 4,4'-diethylamino-benzophenone 2-mercaptobenzothiazole 4-diazo-4'-methoxy-diphenylamine | — — — Irgacure 369(*2) | — — — Irgacure 907(*3) |
| solvent | mixture of ethanol and water (weight ratio 4:1) | mixture of ethanol and water (weight ratio 4:1) | ethyl 3-ethoxypropionate | — |
| developer | water | water | 0.1% aqueous solution of KOH | water |
| evaluation | | | | |
| patterning property | good | good | Film remains considerably | Part of fluorescent layer washed away during development |
| film thickness of fluorescent screen | about 200 μm | about 200 μm | about 15 μm | about 3 μm |

(*2)2-benzyl-2-dimethylamino-1-(4-morpholinophenyl)-butane-1-one
(*3)2-methyl-1-[4-(methylthio)phenyl]-2-morpholinopropane-1-one The composition containing a fluorescent substance dispersed therein of the present invention can provide a fluorescent screen having a larger film thickness and a higher display brightness in comparison with the composition containing a fluorescent substance dispersed therein of the prior art. Therefore, this will greatly contribute to increases in the size and precision of a fluorescent display device such as a plasma display panel, which is expected to further develop in the future.

What is claimed is:

1. A radiation sensitive composition containing a fluorescent substance dispersed therein, comprising:

(A) the fluorescent substance;

(B) an organic polymer binder;

(C) at least one optically crosslinkable compound selected from optically crosslinkable monomers and oligomers; and (D) an optically radical-generating agent comprising (a) a 2,4,5-triaryl imidazole dimer, (b) an amino group-containing benzophenone photosensitizer, and (c) a thiol compound represented by the following formula (1):

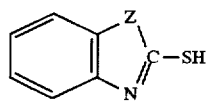

(1)

wherein Z is —O—, —S—, —NH— or —CONH—.

2. The composition of claim 1, wherein the fluorescent substance is at least one red color emitting fluorescent substance selected from the group consisting of $Y_2O_3$:Eu, $Y_2SiO_5$:Eu, $Y_3Al_5O_{12}$:Eu, $YVO_4$:Eu, (Y,Gd)$BO_3$:Eu and $Zn_3(PO_4)_2$:Mn.

3. The composition of claim 1, wherein the fluorescent substance is at least one green color emitting fluorescent substance selected from the group consisting of $Zn_2SiO_4$:Mn, $BaAl_{12}O_{19}$:Mn, $BaMgAl_{14}O_{23}$:Mn, $LaPO_4$:(Ce,Tb) and $Y_3$(Al,Ga)$_5O_{12}$:Tb.

4. The composition of claim 1, wherein the fluorescent substance is at least one blue light emitting fluorescent substance selected from the group consisting of $Y_2SiO_5$:Ce, $BaMgAl_{14}O_{23}$:Eu, (Ca,Sr,Ba)$_{10}$(PO$_4$)$_6$Cl$_2$:Eu, (Ba,Eu)$MgAl_{10}O_{17}$, $Y_2SiO_5$:Ce and (Zn,Cd)S:Ag.

5. The composition of claim 1, wherein the fluorescent substance is contained in an amount of 0.1 to 20 parts by weight based on 1 part by weight of the organic polymer binder.

6. The composition of claim 1, wherein the organic polymer binder is an alkali-soluble resin selected from the group consisting of (meth)acrylic resins, hydroxystyrene resins and novolak resins.

7. The composition of claim 1, wherein the organic polymer binder has a weight average molecular weight in terms of polystyrene, measured by GPC, of 5,000 to 1,000,000.

8. The composition of claim 1, wherein the optically crosslinkable compound is contained in an amount of 0.05 to 5 parts by weight based on 1 part by weight of the organic polymer binder.

9. The composition of claim 1, wherein the optically radical-generating agent is contained in an amount of 0.05 to 5 parts by weight based on 1 part by weight of the optically crosslinkable compound.

10. The composition of claim 1, wherein the amino-group containing benzophenone photosensitizer is contained in an amount of 0.1 to 10 parts by weight based on 1 part by weight of the 2,4,5-triaryl imidazole dimer.

11. The composition of claim 1, wherein the thiol compound represented by the above formula (1) is contained in an amount of 0.1 to 10 parts by weight based on 1 part by weight of the 2,4,5-triaryl imidazole dimer.

* * * * *